(12) United States Patent
Amelung et al.

(10) Patent No.: US 8,071,999 B2
(45) Date of Patent: Dec. 6, 2011

(54) FLAT LIGHTING DEVICES AND METHOD OF CONTACTING FLAT LIGHTING DEVICES

(75) Inventors: Joerg Amelung, Dresden (DE); Christian Kirchhof, Grossdittmannsdorf (DE); Jan Hesse, Dresden (DE); Michael Hoffmann, Dresden (DE)

(73) Assignee: Fraunhofer-Gesellschaft zur Foerderung der angewandten Forschung e.V., Munich (DE)

( * ) Notice: Subject to any disclaimer, the term of this patent is extended or adjusted under 35 U.S.C. 154(b) by 353 days.

(21) Appl. No.: 12/482,301

(22) Filed: Jun. 10, 2009

(65) Prior Publication Data

US 2009/0302729 A1 Dec. 10, 2009

(30) Foreign Application Priority Data

Jun. 10, 2008 (DE) .................. 10 2008 027 519

(51) Int. Cl.
*H01L 33/00* (2010.01)
*H01L 51/00* (2010.01)
(52) U.S. Cl. ...... 257/99; 257/40; 257/103; 257/E33.066
(58) Field of Classification Search ............ 257/40, 257/99, 103, E33.066
See application file for complete search history.

(56) References Cited

U.S. PATENT DOCUMENTS

| 7,878,681 | B2* | 2/2011 | Blumel et al. | 362/231 |
| 7,944,144 | B2* | 5/2011 | Gomi | 313/512 |
| 2008/0048948 | A1* | 2/2008 | Koh et al. | 345/80 |
| 2008/0182062 | A1* | 7/2008 | Becken et al. | 428/68 |
| 2011/0020488 | A1* | 1/2011 | Park et al. | 425/383 |

FOREIGN PATENT DOCUMENTS

| WO | WO 99/26730 | 6/1999 |
| WO | WO 00/26945 | 5/2000 |

* cited by examiner

*Primary Examiner* — Ngan Ngo
(74) *Attorney, Agent, or Firm* — Michael A. Glenn; Glenn Patent Group

(57) ABSTRACT

A flat lighting device includes a layer arrangement, anode and cathode contact regions. The layer arrangement includes an anode layer, a cathode layer, and an organic light-emitting layer arranged between the anode and cathode layers, the layer arrangement having a flat shape which is laterally bounded by an edge region. The anode contact regions contact the anode layer and are implemented along the edge region. The cathode contact regions contact the cathode layer and are implemented along the edge region. The flat shape has a rotational invariance toward rotation by discrete angles. The anode and cathode contact regions may be contacted from one side of the flat shape of the layer arrangement and are arranged to be laterally distributed over the edge region such that the lateral distribution of the anode and cathode contact regions is maintained upon rotation of the layer arrangement by the discrete angles.

19 Claims, 13 Drawing Sheets

FLAT LIGHTING DEVICES AND METHOD OF CONTACTING FLAT LIGHTING DEVICES

CROSS-REFERENCE TO RELATED APPLICATIONS

This application claims priority from German Patent Application No. 102008027519.0, which was filed on Jun. 10, 2008, and is incorporated herein in its entirety by reference.

The present invention relates to flat lighting devices and a method of contacting flat lighting devices, and in particular to side contact structures for large-area OLED (organic light-emitting diode) lighting areas.

BACKGROUND OF THE INVENTION

Novel area lighting elements may be realized on the basis of organic light-emitting diodes. As flat lighting device, which have moderate luminance as compared to conventional LEDs (light-emitting diodes), OLEDs are ideally suited for producing flat diffuse light sources (e.g. lighting panels). These light sources will be applicable in as manifold a manner as the displays which are based on organic light-emitting diodes. Due to the thin-film technology used, it will further become possible in the production of OLEDs to realize flexible lighting devices which will then enable new applications in the illumination of rooms, for example.

Since OLEDs represent current-operated components, an important point in the production of large-area lighting elements is homogeneous current density distribution over large areas. With OLEDs, typically at least one transparent contact is formed, which may comprise, for example, a conductive oxide (TCO, transparent conductive oxide). Alternatively, the transparent contact may also be realized as a transparent metal layer. Due to the low conductivity of the TCO layer, said layers frequently limit the homogeneity of the current density distribution as well as the maximally achievable size of a lighting area.

The standard design of a conventional OLED may be summarized as follows. Indium tin oxide (ITO) having a layer thickness of, e.g., about 100 nm may be used as the transparent conductive oxide, for example, wherein the ITO layer frequently is applied to a glass substrate and may serve as an anode. Subsequently, an organic layer or an organic layer structure, which in some cases may comprise up to seven sub-layers or layers, is applied at a layer thickness of about 100 to 200 nm. Finally, a metallic cathode, which may comprise aluminum, for example, is deposited at a layer thickness of about 100 to 500 nm. With large-area lighting elements, the high-impedance resistance of the ITO layer results in an inhomogeneity of the supply of current. For example, the high-impedance resistance of the ITO layer may comprise, e.g., a value of about 10 to 20 ohm/square measure. One reason for the inhomogeneity is, for example, that often the contacts of the ITO layer are possible only on the edge of the lighting element. Thus, a maximally achievable size with a uniformly luminous OLED is limited to 50×50 mm$^2$, for example.

In order to achieve larger dimensions, for example metal reinforcements may be introduced into the ITO layer in the form of grids. Said metal grids (so-called busbars) reduce the effective layer resistance in accordance with their packing density, and thus enable relatively large diode areas to be realized.

Due to the non-transparency of these metal grids, however, the effective lighting area is reduced accordingly. For this reason, metal grids are practical, for example, only up for to about 25 percent of the ITO area. A useful improvement would be an increase in the grid metal thickness, for example, which, however, is not practical because of the structuring, or patterning, possibilities and the layer thicknesses of the organic layers. Additionally, an ITO layer reinforced by metal is contacted only on the outer edges, which limits the maximum surface area of a lighting element despite the effective reduction in resistance.

Said outer edges may be connected to a distributor plate via spring contacts or similar electrical contacts, for example. Since the total current for the anode and cathode is supplied or drained off via these contacts, the contact should be at least divided into two. In a conventional standard form, two edges (for example in the western and eastern directions) are connected to the anode, and two edges (for example in the northern and southern directions) are connected to the cathode, said directions here being used as designations for the lateral edges when the lighting side of the (e.g. quadrangular) plate is looked upon in a perpendicular manner. This does not result in optimum connections, since the connection resistances are different for the cathode and the anode. In addition, such a conventional arrangement of the contacts is not protected against polarity inversion, since, e.g., rotation of the plate by 90 degrees leads to polarity inversion of the lighting plate. However, in a modification of this contact configuration, only one contact exists in each case on the western or eastern side of the plate.

Due to the limited conductivity of the TCO layer, it is also frequently useful, with conventional lighting areas, to subdivide large lighting areas into individual areas and to lead the contacts into the distributor plate.

For another standard configuration, all contacts are led to one side of the lighting plate. In order to achieve homogenous light distribution in this configuration, a lateral wide contacting line is useful. However, this in turn reduces the lighting area. In addition, all of these conventional connection configurations result in an inhomogeneous supply of current, which leads to increased current densities in various regions (points or lines), and thus reduces the homogeneity of the lighting panel or lighting area, since regions having an increased supply of current have higher luminance, on the one hand. On the other hand, this results in increased wear and tear at the same time, which consequently adversely affects the robustness of the lighting device.

On the basis of this conventional technology, there is thus a need for a flat lighting device which guarantees contacting which is protected against polarity inversion, and which at the same time improves homogeneity of the supply of current.

SUMMARY

According to an embodiment, a flat lighting device may have a layer arrangement including an anode layer, a cathode layer, and an organic light-emitting layer which is arranged between the anode layer and the cathode layer, the layer arrangement including a flat shape which is laterally bounded by an edge region; anode contact regions which contact the anode layer and are formed along the edge region; and cathode contact regions which contact the cathode layer and are formed along the edge region, wherein the flat shape includes a rotational invariance toward rotation by discrete angles, and wherein the anode contact regions and the cathode contact regions may be contacted from one side of the flat shape of the layer arrangement and are arranged to be laterally distributed over the edge region such that the lateral distribution of the anode contact regions and of the cathode contact regions is maintained upon rotation of the layer arrangement by the discrete angles.

According to another embodiment, a module of flat lighting devices may have: a multitude of flat lighting devices including: a layer arrangement including an anode layer, a cathode layer, and an organic light-emitting layer which is arranged between the anode layer and the cathode layer, the layer arrangement including a flat shape which is laterally bounded by an edge region; anode contact regions which contact the anode layer and are formed along the edge region; and cathode contact regions which contact the cathode layer and are formed along the edge region, wherein the flat shape includes a rotational invariance toward rotation by discrete angles, and wherein the anode contact regions and the cathode contact regions may be contacted from one side of the flat shape of the layer arrangement and are arranged to be laterally distributed over the edge region such that the lateral distribution of the anode contact regions and of the cathode contact regions is maintained upon rotation of the layer arrangement by the discrete angles, wherein flat lighting devices of the multitude are combined into a regular arrangement.

According to another embodiment, a method of producing a flat lighting device may have the steps of: forming a layer arrangement including an anode layer, a cathode layer, and an organic light-emitting layer which is arranged between the anode layer and the cathode layer, the layer arrangement including a flat shape with a rotational invariance with regard to rotations by a discrete angle, and being laterally bounded by an edge region; forming anode contact regions along the edge region, the anode contact regions contacting the anode layer; and forming cathode contact regions along the edge region, the cathode contact regions contacting the cathode layer, wherein the anode contact regions and the cathode contact regions are contacted from one side of the flat shape of the layer arrangement and are arranged to be laterally distributed over the edge region such that the lateral distribution of the anode contact regions and of the cathode contact regions is maintained upon rotation of the layer arrangement by the discrete angle.

The core idea of the present invention is that a flat lighting device is realized by a layer arrangement comprising an anode layer, a cathode layer, and an organic light-emitting layer arranged between the anode and cathode layers, in that anode contact regions contact the anode layer, and that cathode contact regions contact the cathode layer, and in that the anode and cathode contact regions are formed along the edge of the layer arrangement. In addition, the anode and cathode contact regions are arranged such that upon rotation by discrete angles, with regard to which the layer arrangement is invariant relative to a holder, cathode contact regions are mapped to cathode contact regions, and/or anode contact regions are mapped to anode contact regions; in other words, in that the anode contact regions and/or the cathode contact regions are arranged over the edge or within an edge region such that they are invariant upon rotations by the discrete angle.

The discrete angle describes the various possibilities of inserting the flat lighting device into the holder into which the flat lighting element is to be inserted. If, for example, the flat lighting device has a square shape, the discrete angle will be 90 degrees, so that a rotation by 90 degrees prior to insertion (or a rotation by 180 or 270 degrees) does not result in polarity inversion of the flat lighting element. The reason for this is that even after a rotation by, e.g., 90 degrees, cathode contact regions and anode contact regions will still be in the same positions relative to the holder.

In further embodiments, the anode contact regions contact the anode layer along the edge region over a first length, and the cathode contact regions contact the cathode layer along the edge over a second length, a functional connection existing between a ratio of the first and second lengths and the sheet resistance ratios of the anode layer and the cathode layer. If, for example, the anode layer has a sheet resistance which is increased by a factor of 5 as compared to the cathode layer, in embodiments the first length is also larger than the second length by a factor of 5. In this context, the first and second lengths generally comprise several sections, so that the first and second lengths refer to the respective total length (sum of the sections).

If the flat lighting device is formed by an n corner, for example, a cathode contact region may be formed, for example, at each corner point, and the one anode contact region, respectively, may be formed along the edge sections which connect two adjacent corner points in each case. Alternatively, in a further embodiment, an anode contact region may also be formed at each corner point, and the one cathode contact region, respectively, may be formed along the edge sections.

Thus, in embodiments, the contact regions (anode contact region and cathode contact region) are arranged symmetrically along the edge so as to ensure connection which is protected against polarity inversion upon rotation of the plate (flat lighting device). In addition, the share of the sizes of the contact areas (circulation length) is proportional to the layer resistance ratio between the anode and cathode layers. In further embodiments, an additional central contact is also formed which further increases the homogeneity of the supply of current. For example, a central contact for the cathode may be formed in that the anode contact region is centrally interrupted, for example, and in that a cathode contact region is formed there. To continue to ensure connection which is protected from polarity inversion, said central contact should be formed along all of the side faces—or at least along those side faces which are mapped to one another upon rotations by the discrete (symmetry) angles. In this embodiment, too, the share of the contact region sizes (circulation length) may be selected to be proportional to the layer resistance ratio between the anode and the cathode. Further embodiments comprises additional subdivided, but symmetrical side connections.

In a further embodiment, the layer arrangement is patterned such that four diode faces result, each of which exhibits anode and cathode layers of their own. Each of these diode faces is associated with a pair of side contacts, which enables the faces to be controlled separately. By means of a corresponding connection, parallel and serial connections of the faces may thus be achieved.

It is also possible that in embodiments only two side faces of the flat lighting device are used for contacting in each case, as a result of which a larger active lighting area may be achieved, since those edge regions which are not used for contacting may also be employed as light-emitting layers. The share of the sizes of the contact areas (side lengths) may in turn be selected to be proportional to the layer resistance ratio between the anode and the cathode. In this embodiment, too, it is possible to form additional central contacts (as described above).

In further embodiments, the corners of the flat lighting device may be leveled accordingly, and side contacts may be formed to be symmetrical only. This enables reducing the beveled corners for installation or mechanical fastening of the lighting panel by means of screwed, clip or adhesive contacts, for example through a hole which has been formed.

Finally, it is possible that in further embodiments the panel is contacted only at the corners (for example by spring contacts). In this context, for example the cover glass, which may finally be arranged on top of the layer arrangement, for example, may have the same size as the substrate. At the corners, the cover glass may be beveled to provide a contacting area at the substrate corners. The substrate may be patterned such that the contact regions for the lid electrode lie on an axis of symmetry which connects mutually opposite corners. The contact area for the base electrode completely encloses the contact area for the lid electrode as well as the active lighting area and thus forms a closed frame. This embodiment, which is also protected against polarity inversion, further minimizes the edge regions, which enables an even larger active lighting area as compared to embodiments which have already been mentioned.

Thus, embodiments include optimized edge contact structures which are suited, in particular, for large lighting areas and guarantee contacting which is protected against polarity inversion. In addition, the homogeneity of the supply of current is improved over conventional variants. Finally, the difference in the electrical conductivity of the contacts (sheet resistance of the anode/cathode) may be taken into account in the dimensioning of the contact areas or of the contact regions, so that as low-impedance contacting as possible is achieved. At the same time, the entire edge region may thus be utilized for contacting as efficiently as possible.

Therefore, the improvements over conventional lighting devices may be summarized as follows:
- production of OLED lighting panels which are protected against polarity inversion,
- improvement of the homogeneity of the supply of current, and
- production of large-format OLED lighting elements.

BRIEF DESCRIPTION OF THE DRAWINGS

Embodiments of the present invention will be detailed subsequently referring to the appended drawings, in which.

DETAILED DESCRIPTION OF THE INVENTION

Figure 1:
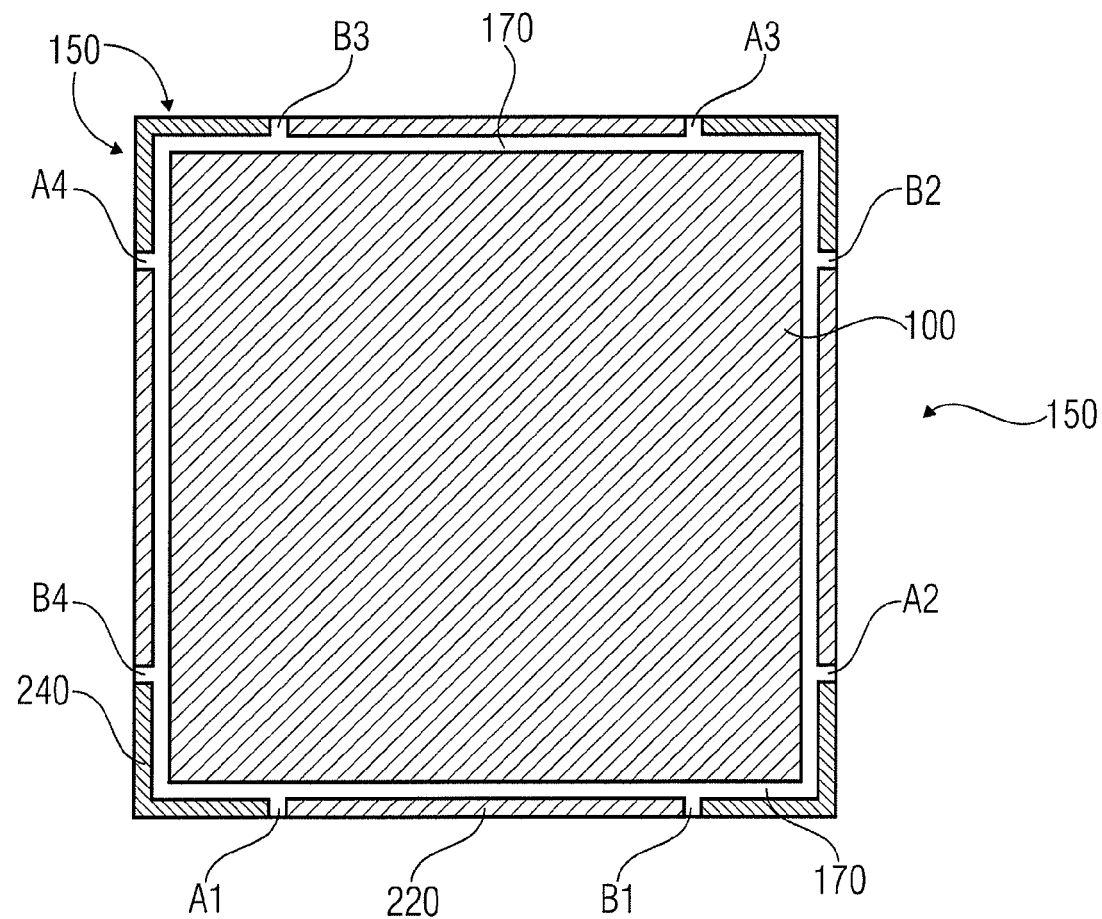
FIG. 1 shows a schematic top view of a flat lighting device in accordance with embodiments of the present invention.

Before discussing the present invention in more detail below with reference to the drawings, it shall be noted that identical elements in the figures are designated by identical or similar reference numerals, and that repeated descriptions of said elements have been omitted.

FIG. 1 shows a schematic top view of a flat lighting device having a layer arrangement 100 which comprises a flat shape and is limited by an edge 150, which may also be implemented as an edge region. In this embodiment, the flat shape is implemented as a square, so that there is a rotational invariance toward rotations by an angle $\alpha=90°$. In addition, the flat lighting device comprises an anode contact region 220 and a cathode contact region 240, the anode and cathode contact regions 220, 240 being implemented along the edge 150 and contacting the layer arrangement 100.

In the embodiment shown in FIG. 1, the cathode contact regions 240 are implemented at the corner points of the square shape of the flat arrangement, while its anode contact regions 220 each are formed between two adjacent corner points. Thus it is ensured that, upon rotation by the angle $\alpha$ ($\alpha=n*90°$, n being integer), both the anode contact regions and the cathode contact regions are mutually mapped to one another in each case, i.e. that contact regions will be arranged in the same manner even after the rotations by the angle $\alpha$.

For example, the layer arrangement 100 may be patterned such that parts of the substrate 110 are left blank between the layer arrangement 100 and the cathode contact regions 240 and/or the anode contact regions 220, so that an insulation 170 results. Alternatively, the insulation 170 may be implemented by additional material.

The anode and cathode contact regions 220, 240 are electrically insulated from one another at points An, Bn, n=1, 2, 3, 4, along the edge 150, so that anode contact regions 220 are implemented between points A1 and B1, between points A2 and B2, between points A3 and B3, and between points A4 and B4. Similarly, cathode contact regions 240 are implemented between points B1 and A2, between points B2 and A3, between points B3 and A4, and finally between points B4 and A1.

Both the anode contact region 220 and the cathode contact region 240 are therefore implemented along four edge sections in each case. Each individual edge section has a length along the edge, so that the anode contact region in total amounts to a first length L1 (=sum of the lengths of the four anode edge sections), and the cathode contact region in total amounts to a second length L2 (=sum of the lengths of the four cathode edge sections). The first and second lengths L1 and L2 may be selected such that, for example, the following relation applies:

$$\frac{RA}{RK} = \frac{L1}{L2},$$

wherein RA designates the sheet resistance of the anode layer, and RK designates the sheet resistance of the cathode layer. The sheet resistances are measured in ohm per square measure, as is customary. Alternatively, there might also be a different functional connection with the lengths for the sheet resistance ratio RA/RK.

In addition, the anode and cathode contact regions 220, 240 may be arranged along the edge 150 in such a manner that they may only be contacted from one side of the flat shape. One example would comprise that they may only be contacted from that direction which projects from the drawing plane of FIG. 1 (i.e. from the direction of the normal to surface).

Figure 2:
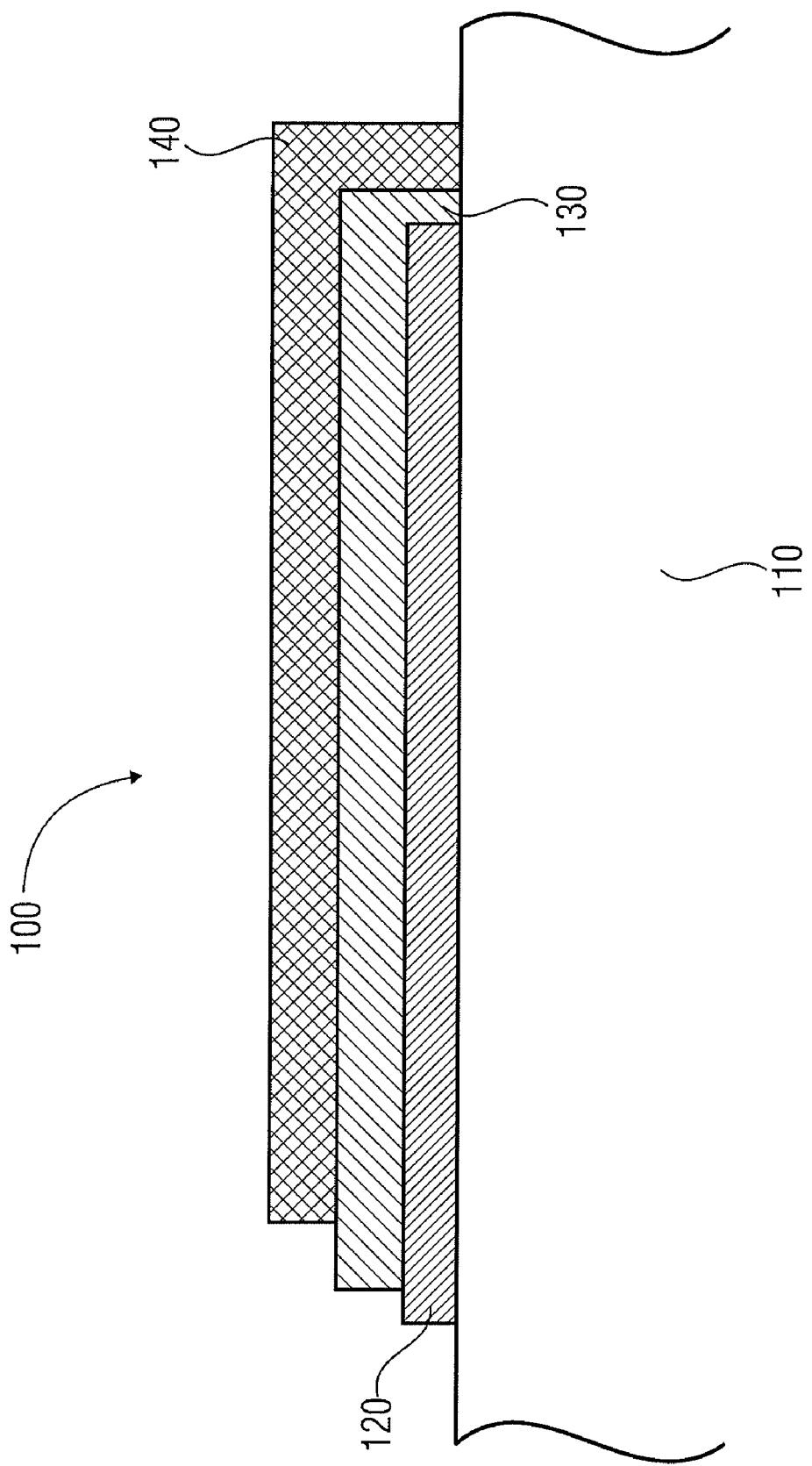
FIG. 2 shows a cross-sectional view of an OLED layer arrangement.

FIG. 2 shows a schematic cross-sectional view of the layer sequence 100, which comprises an OLED on a substrate 110. The OLED has an organic light-emitting layer structure 130, the organic light-emitting layer structure 130 being implemented between an anode layer 120 and a cathode layer 140. In the present example, the anode layer 120 is implemented between the substrate 110 and the organic light-emitting layer structure 130. The organic light-emitting layer structure 130 may, for example, comprise a multitude of layers (e.g. seven sheets, one of which is n-type conducting and another one of which is p-type conducting).

As a potential shape of the flat lighting device, FIG. 1 shows a square, embodiments of the present invention being equally applicable to other shapes.

Figure 3A:
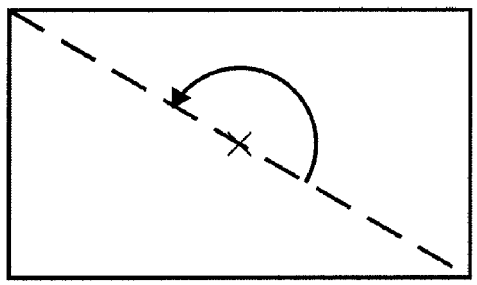
FIGS. 3a to 3e show schematic representations of rotationally invariant flat lighting devices.

FIGS. 3a-3 show five examples of further flat shapes comprising different rotational invariances, the rotational invariance again referring to the different possibilities of rotating the flat lighting device prior to insertion into a holder. The rotational invariance therefore is the symmetry group underlying the potential polarity inversions, the rotations being relative to a holder (fixture), as has been stated. The various rotational invariances may also be employed as alternative definitions for the flat shape, so that, for example, the square shape is equivalent to flat shapes having a rotational invariance of α=90°.

FIG. 3a initially shows a rectangular shape comprising a rotational invariance of 180 degrees, i.e. upon rotation about the axis of rotation by 180 degrees, the axis of rotation being perpendicular to the drawing plane, the flat lighting device is mapped to itself. In this embodiment, too, cathode contact regions may again be implemented along the corners, and anode contact regions 220 may be implemented along the connecting lines between two adjacent corner points (as shown in FIG. 1).

Figure 3B:
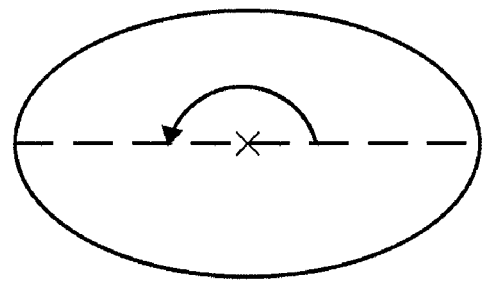

FIG. 3b shows an oval implementation of the flat lighting device which also comprises a rotational invariance for rotations by 180 degrees.

Figure 3C:
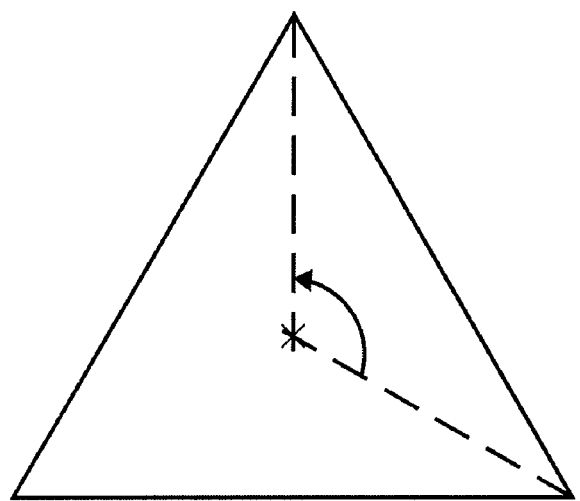

FIG. 3c shows a triangular shape for the flat lighting device, so that a rotational invariance by α=120° results, it being assumed that the triangle in FIG. 3c is an equilateral triangle. If this is not so, the triangle will have no rotational invariance (i.e. only rotations by 360° will map the triangle to itself).

Figure 3D:
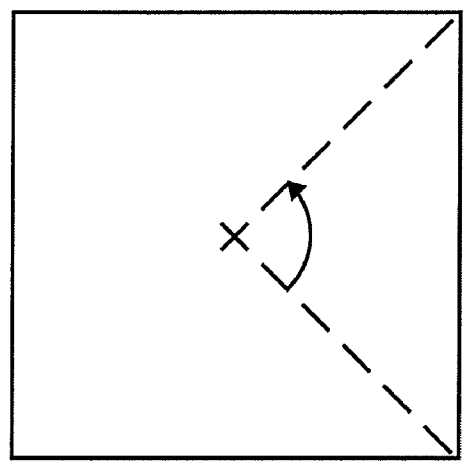

FIG. 3d shows the square shape as was already utilized, for example, in FIG. 1, so that a rotational invariance for rotations by 90° results.

Figure 3E:
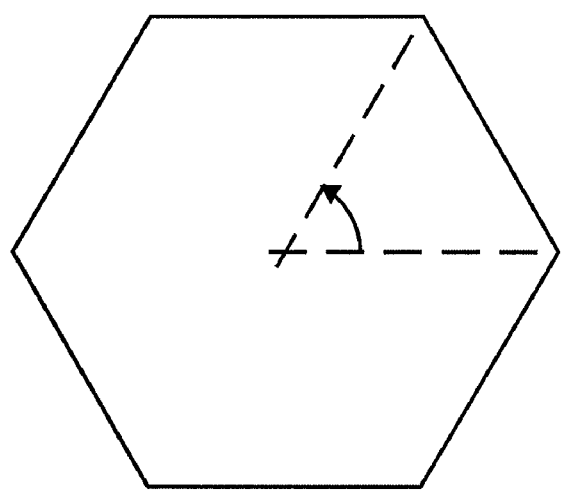

FIG. 3e shows an embodiment wherein the flat lighting device is implemented as a hexagon, so that a rotational invariance of 60° results.

The five examples of the flat shape of the flat lighting device which are shown here merely represent examples which may be further modified (e.g. the corners may be beveled or rounded). In addition, it is possible to select an octagonal shape, for example, which has a rotational invariance of 45°.

In this context, the implementation of the contact regions is to be selected such that the contact regions, too, respect the rotational invariance. This means that following rotations by the discrete angle α (180°, 120°, 90°, 60°, 45°, . . . ), a rotated cathode contact region will be located at the same position as the cathode area which previously was not rotated. It also means that a rotated anode contact region will be located at the same position as a non-rotated anode area. This ensures for rotations, polarity inversions cannot occur, since the cathode contact regions and the anode contact regions 220, 240 will remain at the same positions.

Figure 4A:
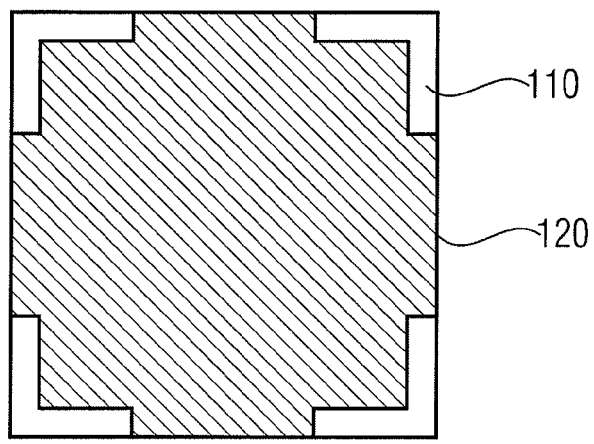
FIGS. 4a to 4c show schematic representations of processing for the flat lighting device in FIG. 1.
Figure 4B:
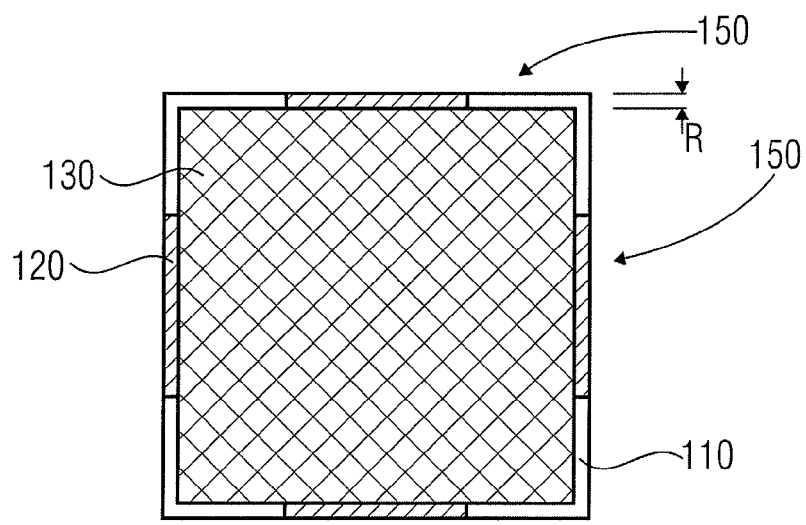
Figure 4C:
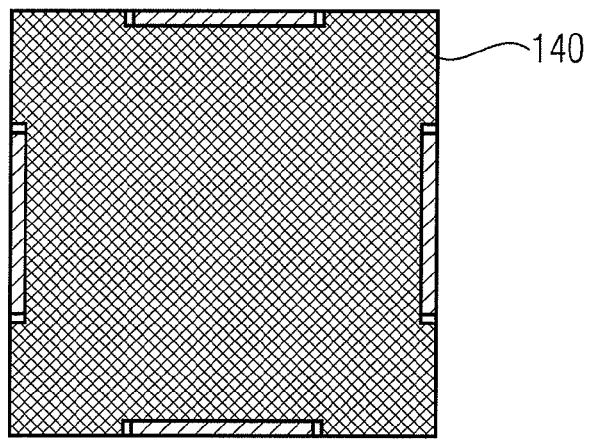

FIGS. 4a to 4c show a potential sequence of processes for processing the flat lighting device, as is shown in FIG. 1, for example. In this context, the anode layer 120 is initially formed on the substrate 110, and is patterned such that the substrate 110 is exposed along the corner points. In order to ensure the above-described rotational invariance, with this patterning, identical or nearly identical areas of the substrate 110 are exposed at all of the corners.

FIG. 4b shows a next step, wherein the organic light-emitting layer structure 130 is deposited onto the anode layer 120, the organic layer structure 130 not being implemented right as far as the edge 150 or as far as edge regions, but leaves an edge distance R blank.

FIG. 4c shows a following step wherein the cathode layer 140 is implemented on the organic light-emitting layer structure 130, the cathode layer 140 being patterned such that, on the one hand, it fills up the corner regions shown in FIG. 4a and, on the other hand, leaves the anode contact regions 120 blank, so that no short-circuit occurs.

Finally, a last step (not shown in FIG. 4) may comprise forming a passivation (e.g. cover glass) on the cathode layer 140, which will then define the cathode contact regions 240 at the corner points, and the anode contact regions 220 along the connecting edge regions between two corners.

Figure 5A:
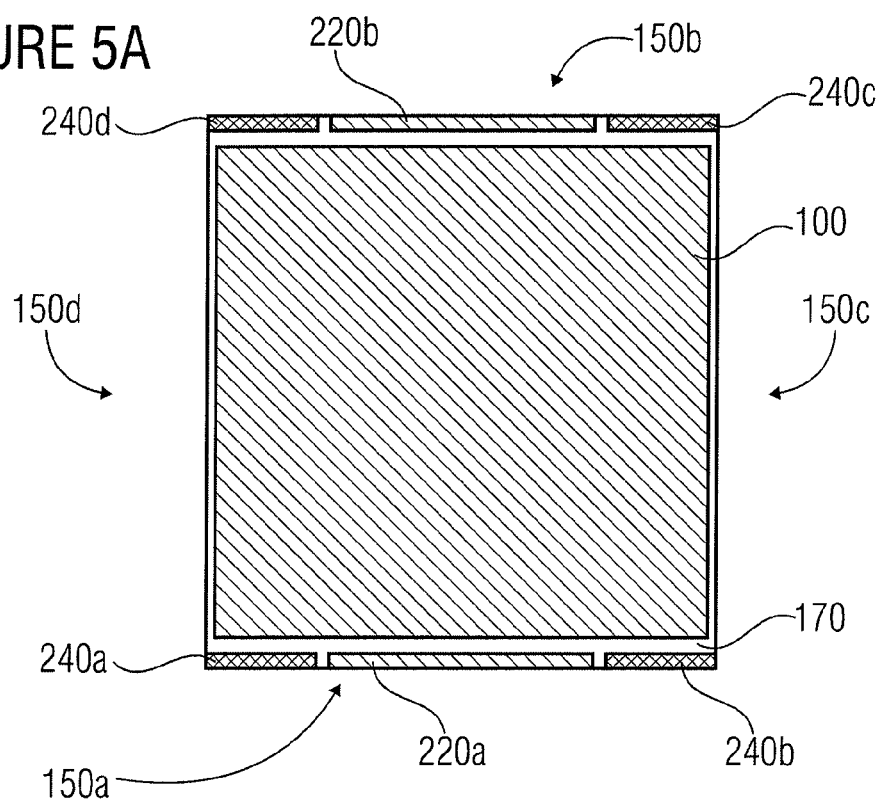
FIGS. 5a, b show top views of further embodiments wherein the contact regions are formed only along part of the edge.

FIGS. 5a, b show a further embodiment of a flat square shape of the lighting device, contacting being performed, in this embodiment, only on two opposite sides of the square shape, and no contacting being performed on the two remaining sides. In this context, the edge 150 may be subdivided into a first edge region 150a, a second edge region 150b, a third edge region 150c, and a fourth edge region 150d, the first and second edge regions 150a, b being opposite each other, and, likewise, the third and fourth edge regions 150c, d being arranged opposite each other.

In the embodiment shown in FIG. 5a, contacting is performed along a base line (edge region 150a) and the line 150b opposite it, the base line having two cathode contact regions 240a, b formed along it, between which an anode contact region 220a is arranged. In a symmetrical shape, two cathode contact regions 240c and 240d are formed on that side (edge region 150b) which is opposite the base line, said two cathode contact regions 240c and 240d having a further anode contact region 220 formed between them. In the embodiment of FIG. 5, no contacting occurs along the third and fourth edge regions 150c and 150d. Consequently, in this embodiment, the layer structure 100 may be further expanded in the direction of the edge 150 (reduction of the edge distance R).

Figure 5B:
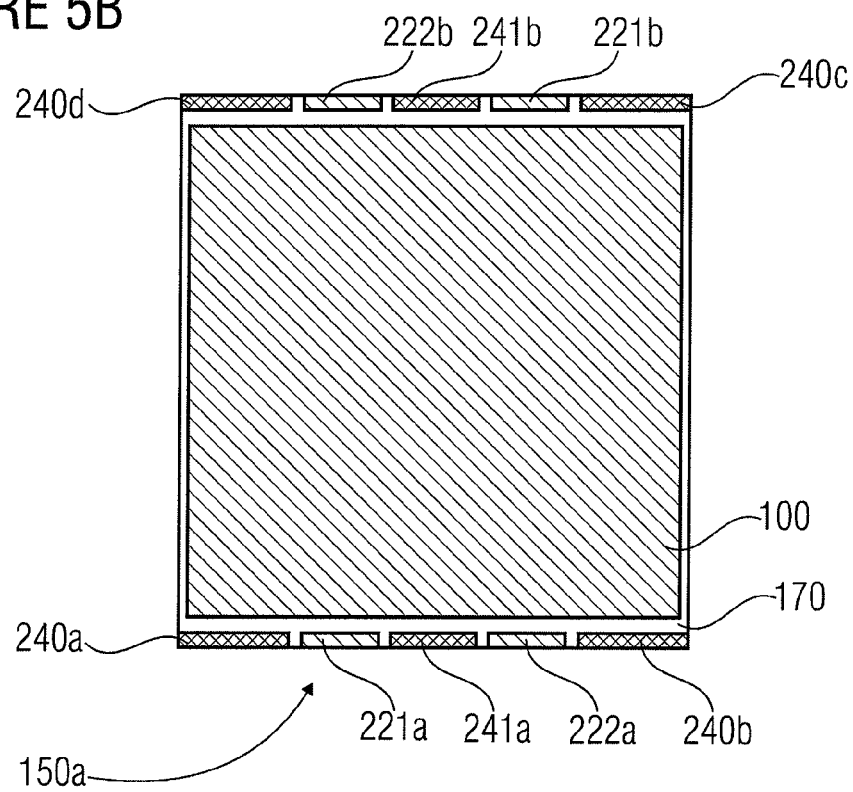

In the embodiment shown in FIG. 5b, a cathode central contact 241a was additionally formed along the first edge region 150a, which cathode central contact 241a is located as centrally as possible between the first cathode contact region 240a and the second cathode contact region 240b. Thus, the first anode contact region 220a of FIG. 5a has been subdivided into a first part 221a and a second part 222a by the cathode central contact 241a. Similarly, a second cathode central contact region 241b was formed along the second edge region 150, which second cathode central contact region 241b is located as centrally as possible between the third cathode contact region 240c and the fourth cathode contact region 240d. Thus, the second anode contact region 220b was also interrupted by the second cathode central contact 241c to form a first part 221b and a second part 222b.

The cathode central contacts 241 may be employed, for example, to achieve an improvement with regard to the homogenous flow of current. In this context, it is advantageous, again, for the anode contact regions 220, 221, 222 to extend, overall, over a length which differs from the total length of the cathode contact regions 240, 241 such that the aspect ratio is proportional to the sheet resistance ratio of the cathode layer and the anode layer (as was already described above in detail).

Figure 6:
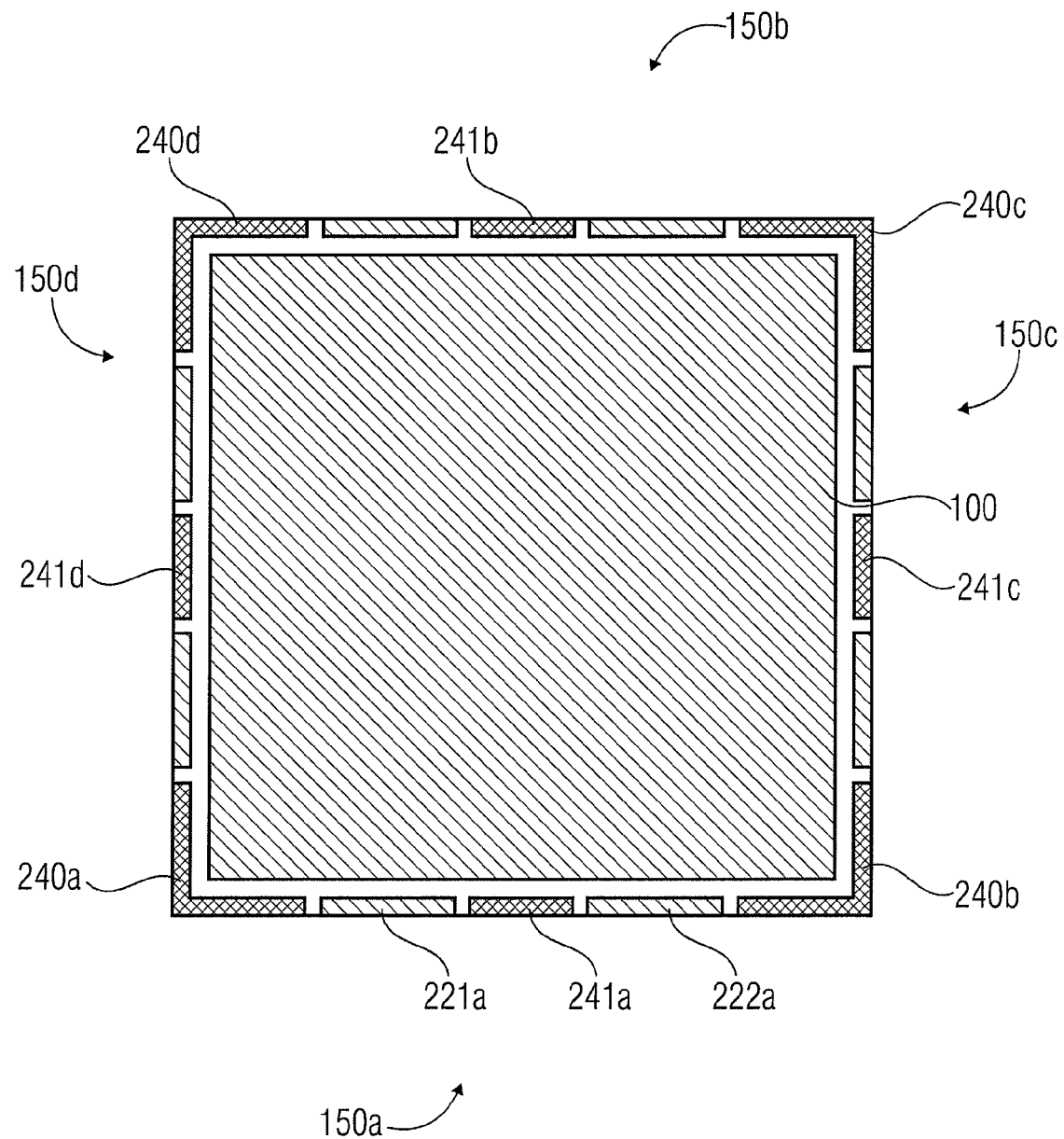
FIG. 6 shows a top view of a flat lighting device comprising central contacts which are formed in accordance with further embodiments.

FIG. 6 shows a further embodiment of a square-shaped flat lighting device, wherein, again, contacting occurs along all of the side faces, all of the side faces comprising central contacts, however, unlike the embodiment shown in FIG. 1. For example, a first cathode central contact 241a, which subdivides the first anode contact region 220a into first and second parts 221a, 222a, is formed along the first edge region 150a, a second cathode central contact 241b is formed along a second edge region 150b, a third cathode central contact region 241c is formed along a third edge region 150c and, finally, a fourth cathode central contact 241d is formed along a fourth edge region 150d. The cathode central contacts 241 are arranged as centrally as possible between the four cathode contact regions 240, at the corner points of the square-shaped lighting device. An anode contact region 220 is formed in each case between two adjacent cathode contact regions 240, respectively.

Figure 7:
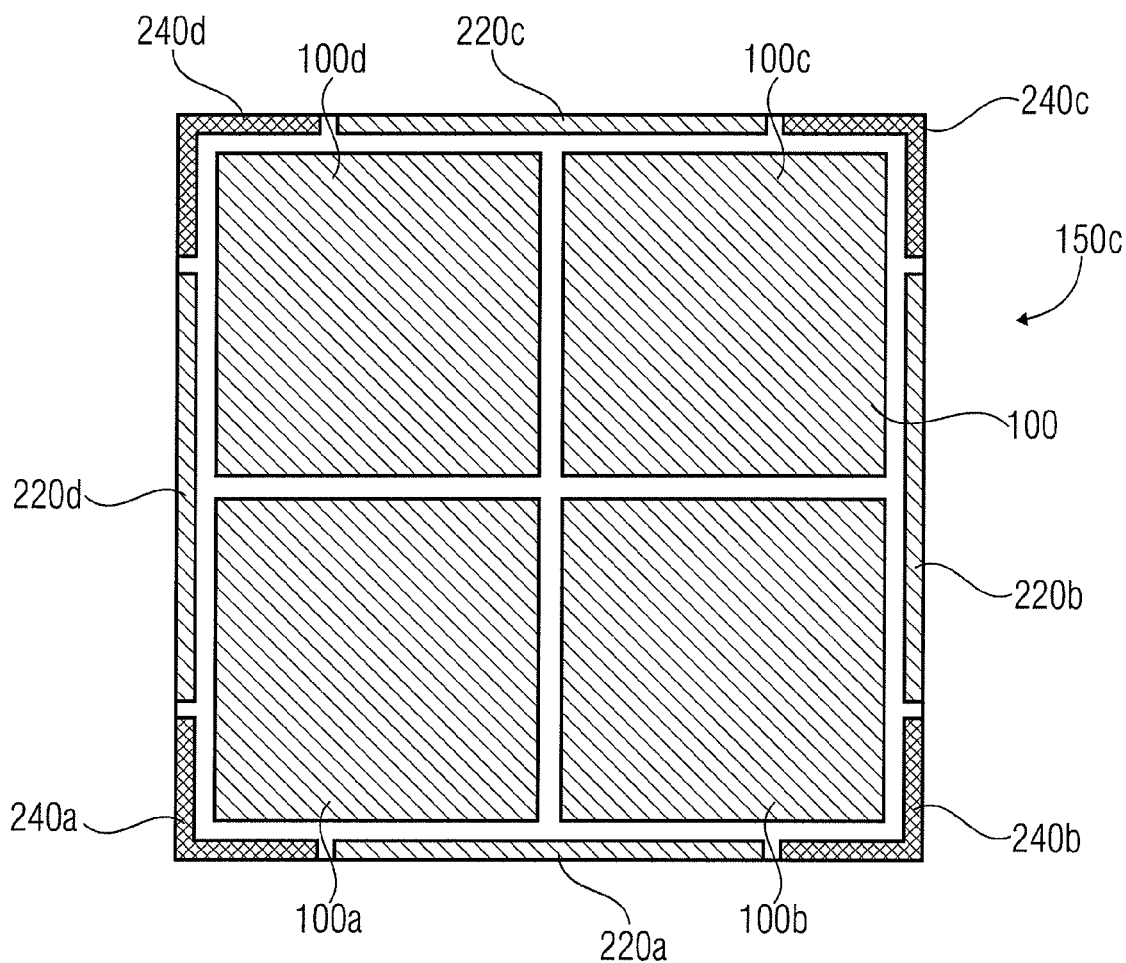
FIG. 7 shows a top view of a flat lighting device comprising four diode faces in accordance with an embodiment.

FIG. 7 shows an embodiment wherein the layer arrangement 100 is patterned to form four regions 100a, 100b, 100c, 100d, each region comprising an anode and a cathode layer 120, 140, which are arranged on opposite sides of an organic light-emitting layer structure 130 and are electrically insulated from one other, for example. The four cathode contact regions 240a, b, c, d formed at the corner points of the flat lighting device, respectively, may contact the respective cathode layer of the adjacent part 100a, b, c, d of the layer arrangement. The four anode contact regions 220a, b, c, d formed between two adjacent cathode contact regions 240 may also be implemented such that they will contact only one anode layer 120, respectively, of a respective part 100a, b, c, d of the layer arrangement 100.

Thus, the four cathode contact regions 240a, b, c, d are electrically insulated from one another. Also, the four anode contact regions 220a, b, c, d are electrically insulated from one another. Thus, it becomes possible for the four parts 100a, b, c, d to be controlled individually via the four cathode contact regions 240 and the four anode contact regions 220a, b, c, d. For example, the first part 100a may be contacted by the first anode contact region 220 and the first cathode contact region 240a. By analogy, the remaining parts 100b, c, d may also be contacted. It is also possible in this context to interconnect the four parts 100a, b, c, d of the layer arrangement 100 in a parallel or serial manner.

Figure 8:
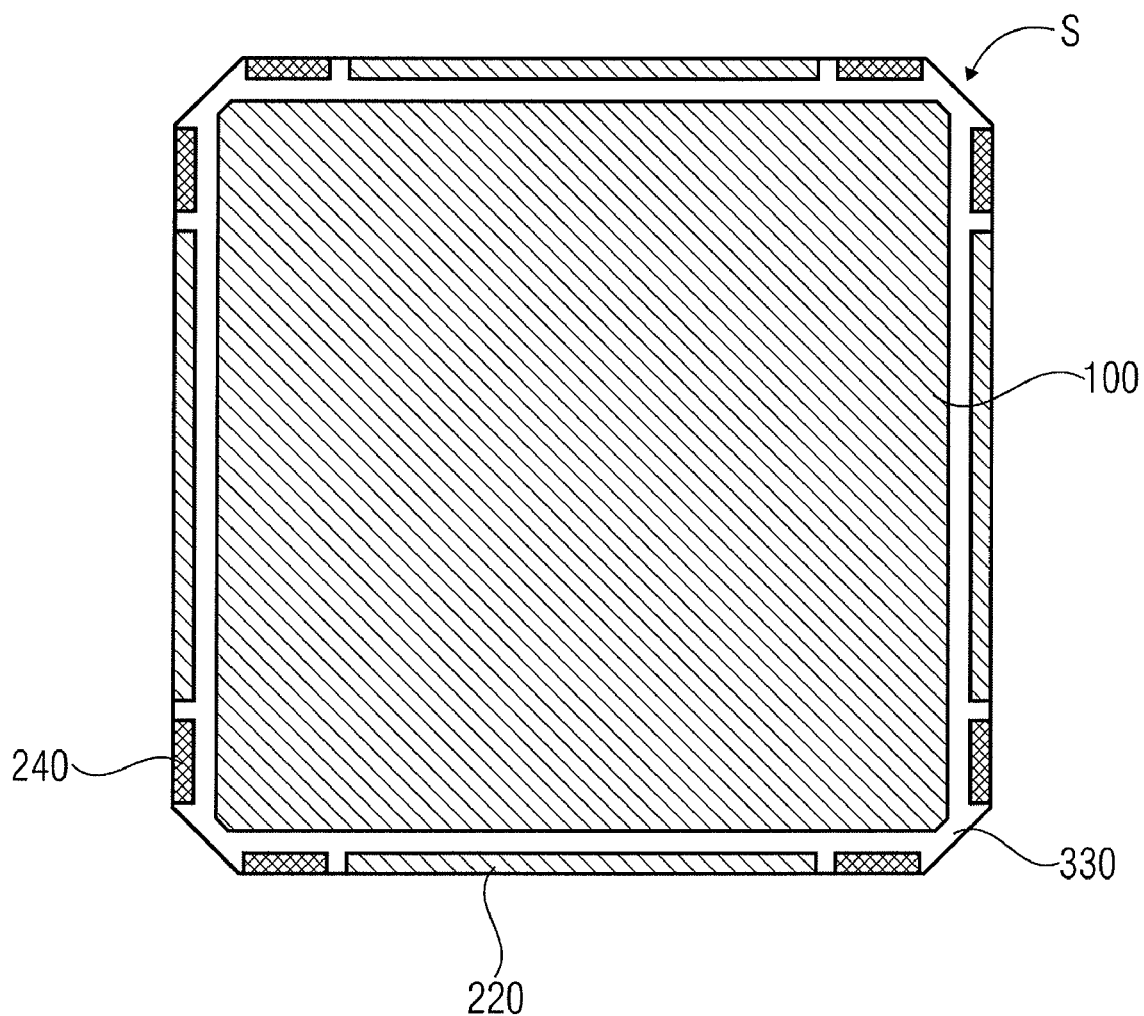
FIG. 8 shows a top view of a flat lighting device comprising beveled corners.

FIG. 8 shows an example wherein the cathode contact regions 240 are not formed directly at the corners, but wherein, instead, the corners of the shape of the flat lighting device, which by way of example is square, are beveled. For example, an insulation 330 may be implemented along the slants S (bevel), and on both sides of the slants S, one cathode contact region 240 may be formed, respectively. In turn, an anode contact region 240 may be arranged between two adjacent cathode contact regions 220. The insulated slants S at the corners may be utilized, for example, to enable mechanical fastening of the flat lighting device.

Figure 9:
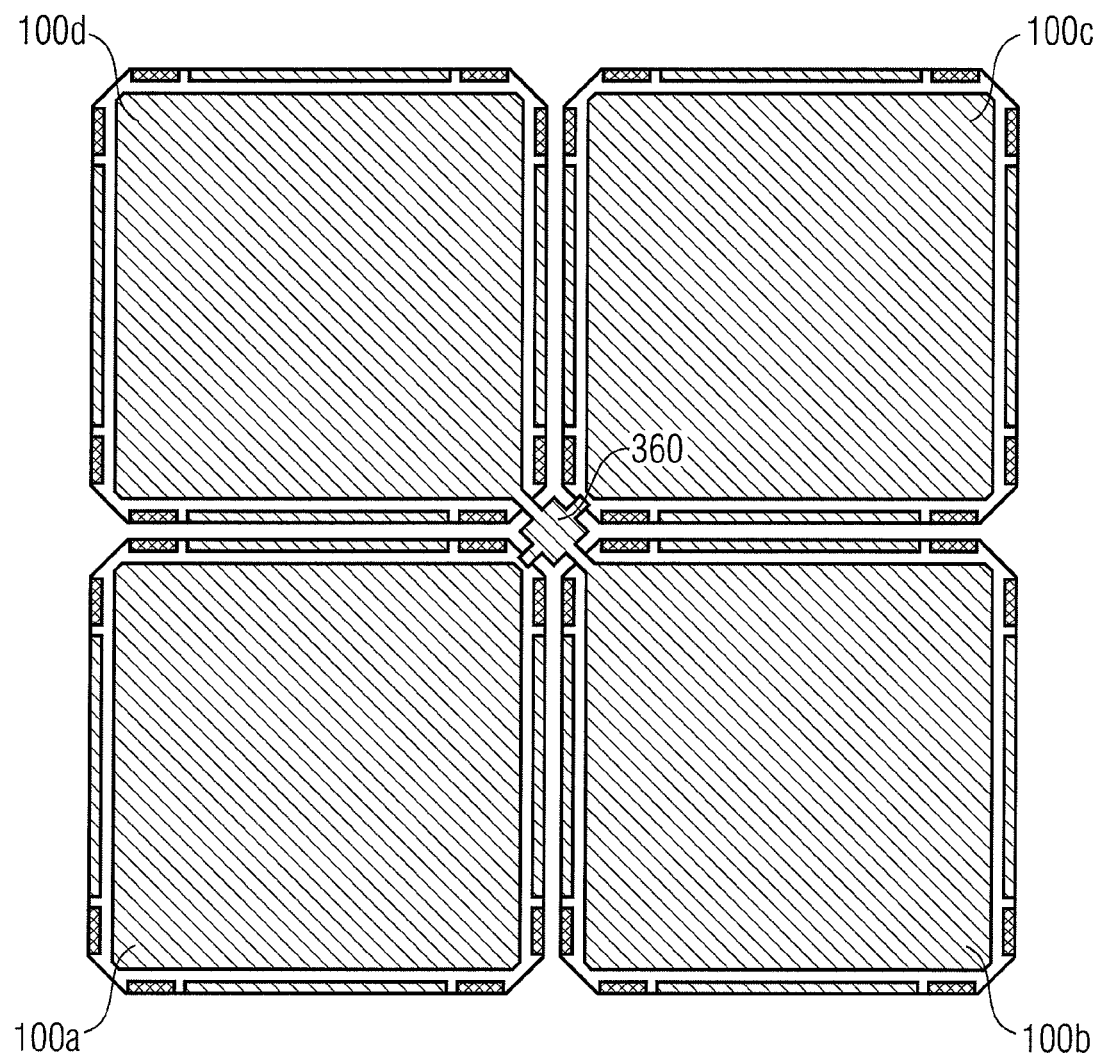
FIG. 9 shows a schematic representation of mechanical fastening of flat lighting devices as are shown in FIG. 8.

FIG. 9 shows an embodiment wherein four square-shaped lighting devices comprising the layer sequences 100a, b, c, d, as are shown in FIG. 8, are joined together, the slants S leading to a hole in the center, which may be utilized, for example, to achieve mechanical fastening of the flat lighting devices by means of clips or clasps 360. The cathode contact regions 240 and the anode contact regions 220 are each implemented symmetrically along the side faces of the flat lighting device (i.e. are arranged in the same manner along all of the edge regions 150a, b, c, d). This is why the cathode contact regions 240 (and/or the anode contact regions 220) may be connected to one other in the array-shaped or regular arrangement as is shown in FIG. 9, so that, for example, parallel connection of the individual lighting devices results.

Figure 10A:
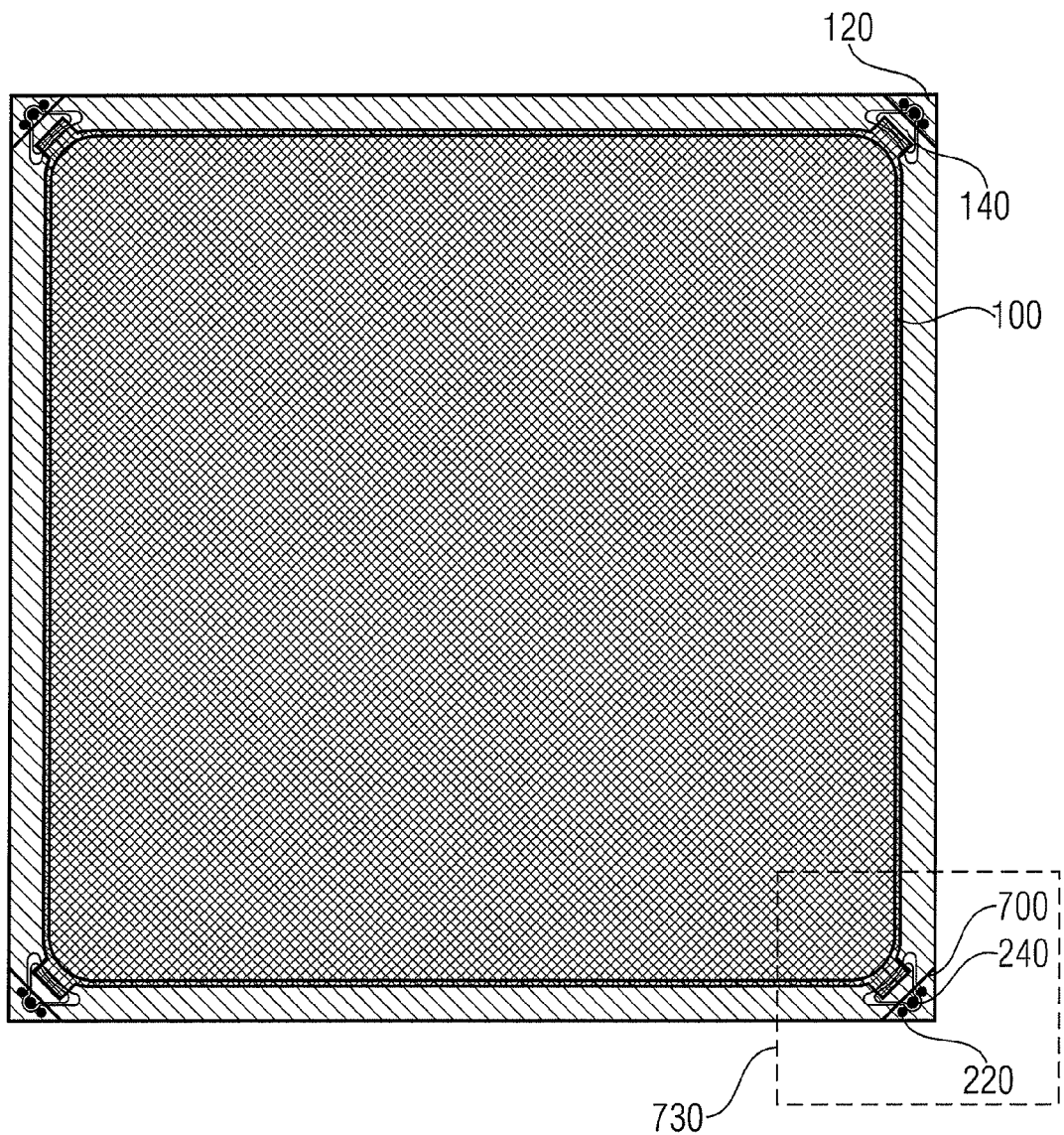
FIGS. 10a,b show a top view and a detailed view of a flat lighting device which comprises contacting at the corner points only.
Figure 10B:
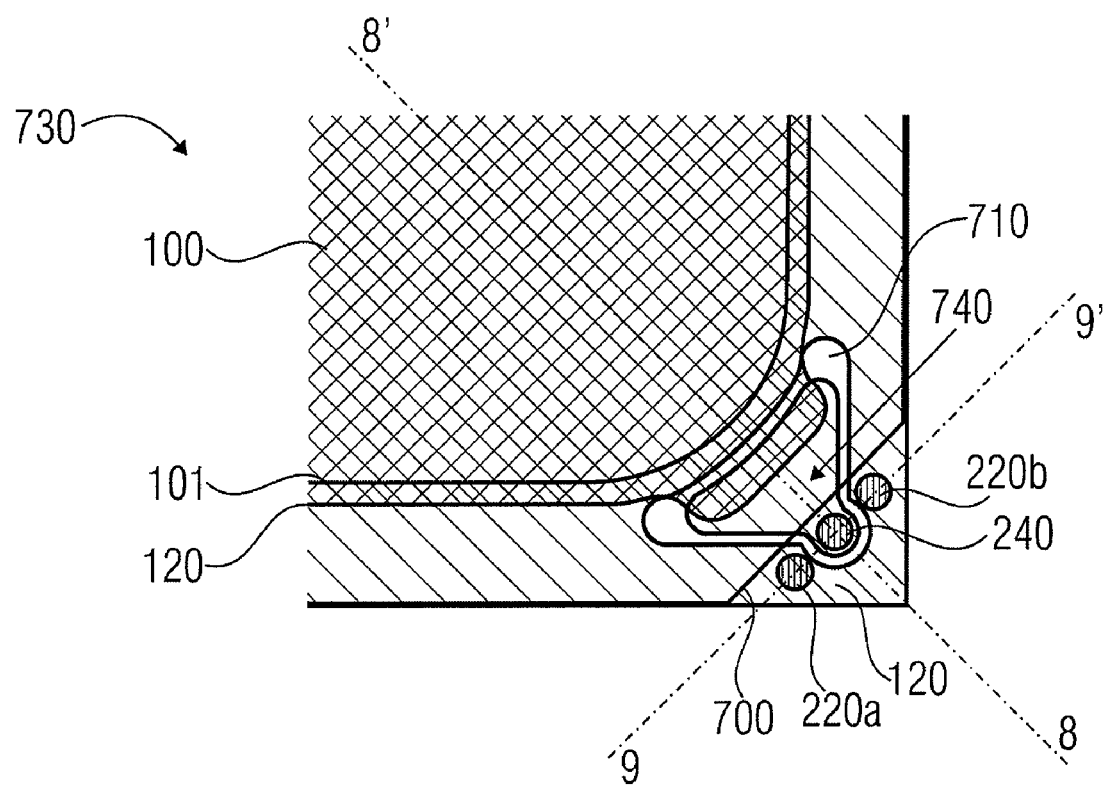

FIGS. 10a and 10b show a further embodiment of a flat lighting device which is contacted at the corners only.

FIG. 10a shows a top view of that side of the lighting device which is opposite the substrate 110, the topmost layer formed being a cover glass comprising slants 700 at the corners, the cover glass being laterally flush with the substrate 110, i.e. having a same size as the substrate 110 except for the slants 700. In this context, each of the four corner points has an identical contact structure, for example, wherein the cathode contact region 240 is formed between two anode contact regions 220, and the anode contact regions and the cathode contact region 220, 240 may be configured as spring contacts and are arranged in that area of the cover glass which is left blank due to the slant 700.

FIG. 10b shows a detailed view of a corner region 730 of the flat lighting device as is shown in FIG. 10a. The layer arrangement 100 is demarcated by a demarcation line 101, it being possible for the organic light-emitting layer 130 to extend as far as the line 102. The organic light-emitting layer 130 has the cathode layer 140 formed thereon, which is contacted by an area 740 in the corner. The anode layer 120 is formed in a flat manner over the substrate 110, so that the anode layer 120 forms a frame which encloses the layer arrangement 100 bounded by the demarcation line 101. The anode layer 120 and the contact region 740 are electrically insulated from each other by an insulation area 710. The contact region 740 has the cathode contact region 240 formed therein, and two anode contact regions 220a, b contact the anode layer 120 which is implemented as a frame. For improved illustration, FIGS. 11 and 12 show sectional views along the intersection lines 8-8', and a sectional view along the intersection line 9-9'.

Figure 11:
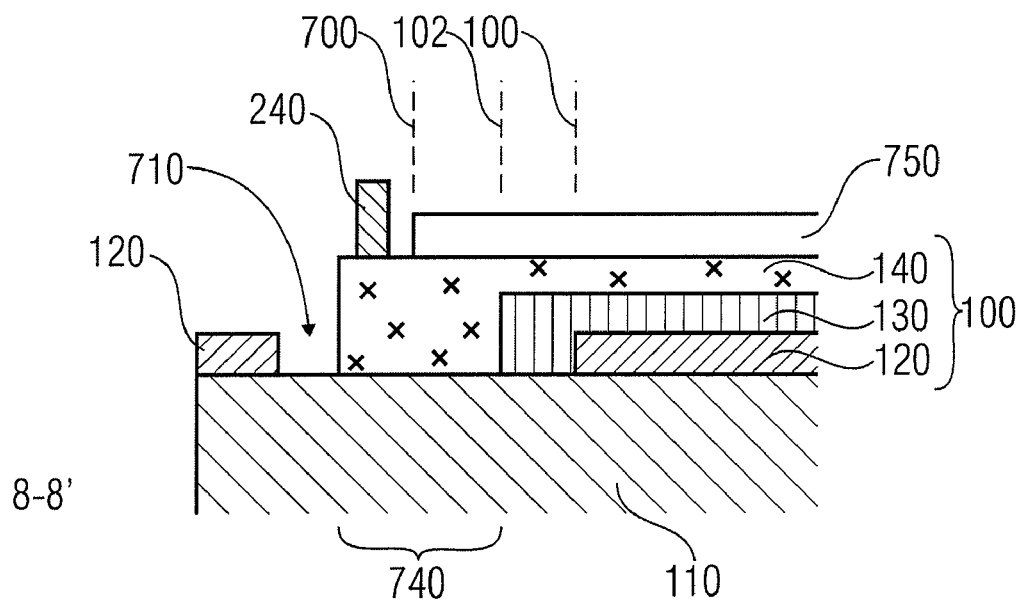
FIG. 11 shows a cross-sectional view along the intersection line 8-8' in FIG. 10b.

FIG. 11 initially shows the cross-sectional view along the intersection line 8-8'. As was already described, the substrate 110 initially has the anode layer 120 formed and patterned thereon. The anode layer 120 has the organic light-emitting layer 130 formed thereon, and the organic light-emitting layer 130 has the cathode layer 140 formed thereon. The anode layer 120 is patterned such that it leaves blank both the insulation area 710 and the region 740 wherein the cathode contact region 240 contacts the cathode layer 140. As a final layer, a cover glass 750 is formed on the layer arrangement 100, the cover glass 750 extending as far as the slant 700 and therefore serving as an insulation for the cathode layer 140. The demarcation line 101 again marks the outer boundary of the layer stack 100, and the demarcation line 102 indicates how far the organic light-emitting layer 130 extends. The substrate 110 may also comprise glass, for example.

Figure 12:
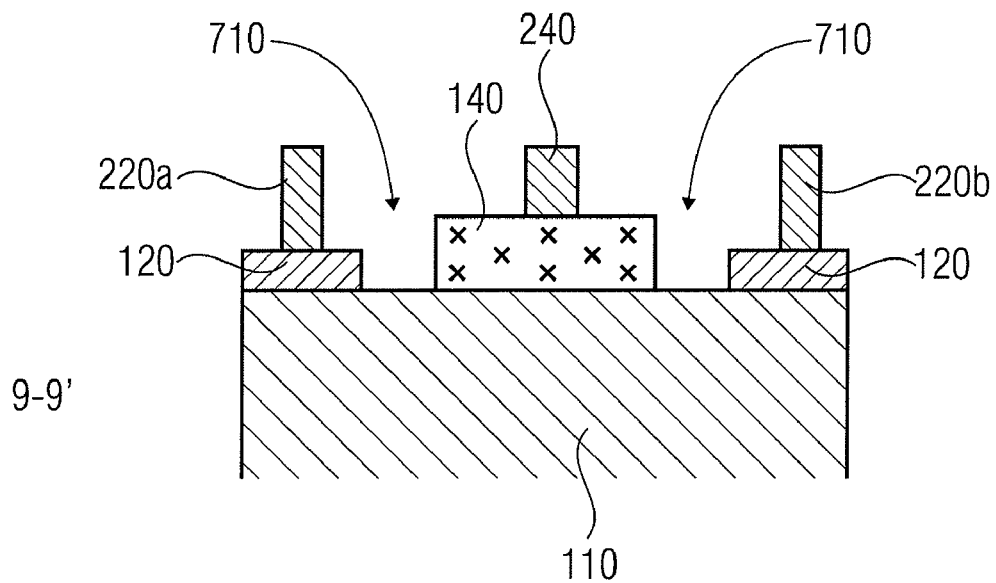
FIG. 12 shows a cross-sectional view along the intersection line 9-9' in FIG. 10b.

FIG. 12 shows a further sectional view along the intersection line 9-9' (see FIG. 10b). Again, the anode layer 120 is shown on the substrate 110, said anode layer 120 being patterned accordingly, so that the insulation area 710 is formed between the anode layer 120 and the cathode layer 140. The anode layer is contacted by two anode contact regions 220a, b, and the cathode layer 140 is contacted by a cathode contact region 240.

In summary, embodiments of the present invention describe a flat lighting device formed, for example, by an organic light-emitting diode, as well as its production. The organic light-emitting diode comprises, for example, a transparent base electrode (anode layer 120) comprising metallic conductor lines in any arrangement, organic layers (organic light-emitting layer 130), and a lid electrode (cathode layer 140). Its production is characterized, for example, in that symmetrical contact areas (anode and cathode contact areas 220, 240) for the base and lid electrodes are located at the outside face, said symmetrical contact areas enabling mounting the OLED into a holder such that it is protected against polarity inversion. The side face ratios may be proportional, for example, to the layer resistance ratio between the base and lid electrodes. In addition, embodiments comprise an organic light-emitting diode, the side corners of which are arranged in a beveled manner so as to enable mechanic fastening with low space requirement for an array structure comprising several panels. Because of the array arrangement, a lighting module can be produced while utilizing several elements. The module may comprise, for example, a multitude of OLED components which may be connected in series and/or in parallel to drive electronics.

Embodiments further comprise organic light-emitting diodes, which in turn comprise a base electrode, organic layers, and a lid electrode and are characterized in that symmetrical contact areas for the base and lid electrodes are formed at the corners, which contact areas enable mounting the OLED into a holder such that it is protected from polarity inversion. In addition, it is possible for the cover glass edges to rest on the substrate. In this embodiment of the organic light-emitting diode, too, it is possible for several components to be combined into one array arrangement, and therefore for a lighting module to be produced. Finally, with this module it is also possible for the OLED components to be connected in series and/or in parallel to drive electronics.

In addition to the lighting devices, embodiments also comprise a method of producing same. For example, the method comprises forming the layer arrangement (100) comprising the anode layer (120), the cathode layer (140), and the organic light-emitting layer (130) which is arranged between the anode layer (120) and the cathode layer (140), the layer arrangement (100) having a flat shape with the rotational invariance with regard to rotations by a discrete angle, and being laterally bounded by an edge region (150). In addition, the method comprises forming the anode contact regions (220) along the edge region (150), the anode contact regions (220) contacting the anode layer (120), and forming the cathode contact regions (240) along the edge region (150), the cathode contact regions (240) contacting the cathode layer (140). The anode contact regions (220) and the cathode contact regions (240) are contacted from one side of the flat shape of the layer arrangement (100) and are arranged to be laterally distributed over the edge region (150) such that the lateral distribution of the anode contact regions (220) and of the cathode contact regions (240) is maintained upon rotation of the layer arrangement (100) by the discrete angle.

While this invention has been described in terms of several embodiments, there are alterations, permutations, and equivalents which fall within the scope of this invention. It should also be noted that there are many alternative ways of implementing the methods and compositions of the present invention. It is therefore intended that the following appended claims be interpreted as including all such alterations, permutations and equivalents as fall within the true spirit and scope of the present invention.

The invention claimed is:

1. A flat lighting device, comprising:
a layer arrangement comprising an anode layer, a cathode layer, and an organic light-emitting layer which is arranged between the anode layer and the cathode layer, the layer arrangement comprising a flat shape which is laterally bounded by an edge region;
anode contact regions which contact the anode layer and are formed along the edge region; and
cathode contact regions which contact the cathode layer and are formed along the edge region,
wherein the flat shape comprises a rotational invariance toward rotation by discrete angles, and wherein the anode contact regions and the cathode contact regions may be contacted from one side of the flat shape of the layer arrangement and are arranged to be laterally distributed over the edge region such that the lateral distribution of the anode contact regions and of the cathode contact regions is maintained upon rotation of the layer arrangement by the discrete angles.

2. The flat lighting device as claimed in claim 1, wherein the anode contact regions contact the anode layer along the edge region over a first length, and wherein the cathode contact regions contact the cathode layer along the edge region over a second length,
a functional connection existing between a ratio of the first and second lengths and a ratio of the sheet resistance of the anode layer to the sheet resistance of the cathode layer.

3. The flat lighting device as claimed in claim 2, wherein the ratio of the first length to the second length is proportional to the ratio of the sheet resistance of the anode layer to the sheet resistance of the cathode layer.

4. The flat lighting device as claimed in claim 1, wherein the flat shape of the layer arrangement forms a polygon, wherein corner points of the polygon comprise cathode contact regions formed thereat, and wherein the anode contact regions are formed along side lines between two adjacent corner points of the polygon, respectively.

5. The flat lighting device as claimed in claim 1, wherein the flat shape of the layer arrangement forms a polygon, wherein corner points of the polygon comprise anode contact regions formed thereat, and wherein the cathode contact regions are formed along side lines between two adjacent corner points of the polygon.

6. The flat lighting device as claimed in claim 4, wherein a central contact is formed along the side lines, the central contact being formed as a further cathode contact region if cathode contact regions are formed at the corner points, or being formed as a further anode contact region if anode contact regions are formed at the corner points.

7. The flat lighting device as claimed in claim 1, wherein the flat shape forms a polygon and wherein the anode contact regions and the cathode contact regions are formed only on two adjacent lateral edges of the polygon.

8. The flat lighting device as claimed in claim 1, wherein the flat shape forms a rectangle, four anode contact regions and four cathode contact regions being formed along the edge region of the rectangle, and
wherein the layer arrangement comprises four regions comprising mutually electrically insulated anode layers and/or mutually electrically insulated cathode layers, one anode contact region contacting at least one anode layer in each case, and one cathode contact region contacting at least one cathode layer in each case.

9. The flat lighting device as claimed in claim 1, wherein anode contact regions and cathode contact regions are formed only at two opposite edge regions.

10. The flat lighting device as claimed in claim 1, wherein the flat shape forms a polygon, wherein corner points of the polygon comprise a slant, and wherein an insulation is formed along the slant, and wherein the slant may be used for mechanical fastening of the flat lighting device.

11. The flat lighting device as claimed in claim 1, wherein the cathode contact regions and the anode contact regions are formed in a corner region of the edge region such that they are mutually electrically insulated.

12. The flat lighting device as claimed in claim 11, wherein a cathode contact region is arranged, in the corner region, between two anode contact regions, and an insulating region is formed between the cathode contact region and the two anode contact regions.

13. The flat lighting device as claimed in claim 11, further comprising a cover glass, and wherein the cover glass is laterally flush with the substrate and wherein the cover glass comprises a bevel along the corner region, so that the anode contact regions and the cathode contact region may be contacted from a side which faces away from the substrate.

14. The flat lighting device as claimed in claim 11, wherein the anode layer comprises a laterally larger expansion that the light-emitting organic layer, so that the anode layer forms a frame for the layer arrangement and may be contacted, at corner regions, by two anode contact regions.

15. A module of flat lighting devices, comprising:
a multitude of flat lighting devices comprising:
   a layer arrangement comprising an anode layer, a cathode layer, and an organic light-emitting layer which is arranged between the anode layer and the cathode layer, the layer arrangement comprising a flat shape which is laterally bounded by an edge region;
   anode contact regions which contact the anode layer and are formed along the edge region; and
   cathode contact regions which contact the cathode layer and are formed along the edge region,
   wherein the flat shape comprises a rotational invariance toward rotation by discrete angles, and wherein the anode contact regions and the cathode contact regions may be contacted from one side of the flat shape of the layer arrangement and are arranged to be laterally distributed over the edge region such that the lateral distribution of the anode contact regions and of the cathode contact regions is maintained upon rotation of the layer arrangement by the discrete angles,
   wherein flat lighting devices of the multitude are combined into a regular arrangement.

16. The module as claimed in claim 15, further comprising a control circuit, the multitude of flat lighting devices being connectable in a parallel or serial manner by the control circuit.

17. The module as claimed in claim 15, wherein the flat shape of the multitude of flat lighting devices forms a polygon comprising beveled corners in each case, so that in a regular arrangement of the multitude of flat lighting devices a gap is left between the flat lighting devices, a mechanical fixture of the flat lighting devices being formed in the gap.

18. A method of producing a flat lighting device, comprising:
   forming a layer arrangement comprising an anode layer, a cathode layer, and an organic light-emitting layer which is arranged between the anode layer and the cathode layer, the layer arrangement comprising a flat shape with a rotational invariance with regard to rotations by a discrete angle, and being laterally bounded by an edge region;
   forming anode contact regions along the edge region, the anode contact regions contacting the anode layer; and
   forming cathode contact regions along the edge region, the cathode contact regions contacting the cathode layer,
   wherein the anode contact regions and the cathode contact regions are contacted from one side of the flat shape of the layer arrangement and are arranged to be laterally distributed over the edge region such that the lateral distribution of the anode contact regions and of the cathode contact regions is maintained upon rotation of the layer arrangement by the discrete angle.

19. The method as claimed in claim 18, wherein forming the anode contact regions and the cathode contact regions is performed such that the anode contact regions contact the anode layer along the edge region over a first length, and that the cathode contact regions contact the cathode layer along the edge region over a second length,
   a functional connection existing between a ratio of the first and second lengths and a ratio of the sheet resistance of the anode layer to the sheet resistance of the cathode layer.

* * * * *